United States Patent
Kehrer et al.

(10) Patent No.: US 12,001,516 B2
(45) Date of Patent: Jun. 4, 2024

(54) METHOD AND ASSISTANCE SYSTEM FOR PARAMETERIZING AN ANOMALY DETECTION METHOD

(71) Applicant: Siemens Aktiengesellschaft, Munich (DE)

(72) Inventors: Johannes Kehrer, Munich (DE); Christoph Paulitsch, Karlsruhe (DE); Stefan Hagen Weber, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 546 days.

(21) Appl. No.: 17/277,067

(22) PCT Filed: Aug. 30, 2019

(86) PCT No.: PCT/EP2019/073176
§ 371 (c)(1),
(2) Date: Mar. 17, 2021

(87) PCT Pub. No.: WO2020/057937
PCT Pub. Date: Mar. 26, 2020

(65) Prior Publication Data
US 2022/0051051 A1     Feb. 17, 2022

(30) Foreign Application Priority Data
Sep. 18, 2018 (EP) ..................................... 18195130

(51) Int. Cl.
*G06K 9/62*     (2022.01)
*G06F 18/213*     (2023.01)
(Continued)

(52) U.S. Cl.
CPC ............ *G06F 18/23* (2023.01); *G06F 18/213* (2023.01); *G06F 30/20* (2020.01); *G06T 7/0004* (2013.01);
(Continued)

(58) Field of Classification Search
CPC ............ G05B 23/0221; G05B 23/0281; G06F 17/30598; G06F 30/20; G06K 9/6218;
(Continued)

(56) References Cited

U.S. PATENT DOCUMENTS

| 10,743,821 | B2 * | 8/2020 | Bandyopadhyay .... A61B 5/364 |
| 11,061,885 | B2 * | 7/2021 | Potulska ........... G06F 16/24568 |

(Continued)

FOREIGN PATENT DOCUMENTS

| CN | 101859324 | 10/2010 |
| CN | 107077135 | 8/2017 |

(Continued)

OTHER PUBLICATIONS

International Search Report and Written Opinion in corresponding PCT Patent Application No. PCT/EP2019/073176 dated Nov. 21, 2019. 21 pages.

(Continued)

*Primary Examiner* — Hoa Q Pham
(74) *Attorney, Agent, or Firm* — Schmeiser, Olsen & Watts LLP

(57) ABSTRACT

A method for parameterizing an anomaly detection method, which takes a multiplicity of sensor data points as a basis for performing a density-based cluster method, including a) mapping each sensor data point in a data space into a pixel data point in a pixel space, b) reproducing at least one operation of the density-based cluster method in the data space by means of at least one pixel operation in the pixel space, c) receiving at least one parameter value for each (Continued)

parameter of the density-based cluster method, d) applying the at least one pixel operation in accordance with the parameter values to the pixel data points e) outputting a cluster result in visual form in the pixel space, and f) providing the received parameter values for the anomaly detection method, and an assistance apparatus for parameterizing an anomaly detection apparatus that performs the anomaly detection method.

17 Claims, 7 Drawing Sheets

(51) Int. Cl.
G06F 18/23 (2023.01)
G06F 30/20 (2020.01)
G06T 7/00 (2017.01)

(52) U.S. Cl.
CPC ..... G06T 2200/24 (2013.01); G06T 2207/10024 (2013.01); G06T 2207/30108 (2013.01)

(58) Field of Classification Search
CPC ............ G06K 9/6232; G06T 7/0004; G06T 2207/30108; G06T 2207/10024; G06T 2200/24
USPC ................................. 382/141–154
See application file for complete search history.

(56) References Cited

U.S. PATENT DOCUMENTS

| 2010/0290701 | A1* | 11/2010 | Puneet | G06T 7/11 |
| | | | | 382/164 |
| 2011/0072016 | A1 | 3/2011 | Tsai et al. | |
| 2021/0342570 | A1* | 11/2021 | Gregson | G06V 10/82 |
| 2022/0253463 | A1* | 8/2022 | Du | G06F 16/906 |
| 2022/0253641 | A1* | 8/2022 | Chung | G06T 7/001 |
| 2023/0297095 | A1* | 9/2023 | Oelke | G05B 23/024 |
| | | | | 702/182 |

FOREIGN PATENT DOCUMENTS

| CN | 108073861 | 5/2018 |
| EP | 3210088 | 11/2019 |

OTHER PUBLICATIONS

Dittrich, Jens et al., "Die Umgedrehte Vorlesung—Chancen für die Informatiklehre," Datenbank-Spektrum, pp. 69-76, XP055525303, Berlin/Heidelberg; DOI: 10.1007/s13222-013-0143-9, Gefunden im Internet: URL:http://www.dbs.ifi.lmu.de/Lehre/KDD/WS0910/skript/kdd-5-clustering.pdf; [gefunden am Nov. 20, 2018]; pp. 17-26; 2014; 107 pages.

Nagarju S., et al., "An effective density based approach to detect complex data clusters using notion of neighborhood difference," International Journal of Automation and Computing, Zhongguo Kexue Zazhishe, CN, vol. 14, No. 1, pp. 57-67, XP036141705, ISSN: 1476-8186, DOI: 10.1007/S11633-016-1038-7; [gefunden am Dec. 29, 2016], the whole document; 2016; 11 pages.

International Preliminary Report on Patentability in corresponding PCT Patent Application No. PCT/EP2019/073176 dated Aug. 30, 2019. 6 pages.

Extended European Search Report in corresponding European Patent Application No. 18195130.2 dated Feb. 22, 2019. 7 pages.

Wikipedia "DBSCAN," https://de.wikipedia.org/wiki/DBSCAN; retrieved Aug. 8, 2019; (mentioned in WO-Request dated Aug. 9, 2019); 11 pages.

Meijster, A., et al., "A General Algorithm for Computing Distance Transforms in Linear Time," In Mathematical Morphology and its Applications to Image and Signal Processing, pp. 331-340, Springer, 2000; 10 pages.

* cited by examiner

METHOD AND ASSISTANCE SYSTEM FOR PARAMETERIZING AN ANOMALY DETECTION METHOD

CROSS-REFERENCE TO RELATED APPLICATIONS

This application is a national stage entry of PCT Application No. PCT/EP2019/073176 having a filing date of Aug. 30, 2019, which claims priority to European Patent Application No. 18195130.2, having a filing date of Sep. 18, 2018, the entire contents of which are hereby incorporated by reference.

FIELD OF TECHNOLOGY

The following relates to a method, an assistance system and a computer program product for parameterizing an anomaly detection method which approximates a density-based cluster method in real time on the basis of a multiplicity of sensor data points.

BACKGROUND

Data-based anomaly detection is used in industrial installations to detect undesirable or hazardous operating states of machines or other components of the installation at an early stage and to be able to react thereto in a timely manner, for example by shutdown or repair.

Examples of anomalies in industrial installations that are intended to be detected on the basis of data recorded mainly by sensors are unwanted reductions in production, wear-dictated device faults, wear phenomena, incorrect settings of devices, but also drops in demand, drops in production or losses of quality.

Technical methods for anomaly detection are usually based on a specific parameterization, that is to say the selection of input parameters, of the algorithms used. The better the delimitation between normal and abnormal behavior, the better that proper operation can be ensured and costs resulting from anomalies can be avoided.

One widely used method for anomaly detection is that of training a density-based clustering algorithm on data, in particular sensor data from proper operation, that is to say data without anomalies. This method is very selective, but difficult to parameterize. In the case of two-dimensional data, the results from the clustering algorithm can be visualized for checking purposes in the form of a scatter diagram in which the points are colored according to their anomaly status or their association with a cluster.

A correct setting of the parameter values of such clustering algorithms, also referred to hereinafter as cluster methods for short, is important, but also very time-consuming. Even a small deviation of the parameter values from the domain-specific and user-dependent optimum can result in altered cluster formation and thus poorer detection rates.

Automated methods are known which yield proposals concerning an initial parameterization of a density-based clustering algorithm. Such automated methods have the disadvantage that the parameterization results from a rule, which only approximates the optimum for a concrete case, and does not take account of current information such as, for example, context and domain knowledge of a user. The user should as far as possible also understand how the automated method for determining parameters functions and forms the parameters.

Furthermore, a user of a cluster method who cannot comprehend the underlying clustering algorithm in detail must nevertheless be able to understand how changes in the parameter values of the algorithm effect the cluster result. It is therefore necessary for a user to set or readjust suitable parameter values manually. For this purpose, at least one or a plurality of the parameter values is/are changed and the clustering algorithm with the new parameter values is started. The calculation of the cluster association by the clustering algorithm is very time-intensive. The calculation takes from seconds to hours depending on the number of underlying data points. The cluster result can subsequently be evaluated for example by visualization or error measures that are output. In order to obtain a useable clustering result, multiple parameter changes and calculation of the respective cluster results are often necessary.

SUMMARY

Therefore, an aspect of the present invention is to accelerate the establishment of parameters for anomaly detection in a time-optimized manner and with the inclusion of domain knowledge of a user.

An aspect relates to a method for parameterizing an anomaly detection method which carries out a density-based cluster method on the basis of a multiplicity of sensor data points, comprising
 a) mapping each sensor data point in a data space into a pixel data point in a pixel space,
 b) simulating at least one operation of the density-based cluster method in the data space by means of at least one pixel operation in the pixel space,
 c) receiving at least one parameter value for each parameter of the density-based cluster method,
 d) applying the at least one pixel operation to the pixel data points according to the received parameter values,
 e) outputting a cluster result in visual form in the pixel space, and
 f) providing the received parameter values as parameters for the anomaly detection method.

The designations cluster analysis, cluster analysis method, clustering method and cluster method are used as synonyms below.

By means of mapping the sensor data points into the pixel space and simulating the cluster method by means of pixel operations, not only is it possible for a result of the cluster method to be represented more rapidly, but the simulated cluster method as such can be implemented more rapidly. Complex calculations of the clusters according to the actual clustering algorithm are approximated and replaced by graphical or visual methods. Operations in the pixel space can be carried out by powerful hardware such as graphics cards, for example, and time-optimized algorithms.

A sensor data point comprises at least two characteristic variables, also referred to as variables for short, of a device, such as, for example, power, speed, voltage, current, rotational speed, torque, but also number of items, quality, number or duration, at one point in time, for example, or in a specific operating mode of a device or of an installation component. In a data space, sensor data are present as values without any other reference. A pixel data point in a pixel space denotes a pixel assigned to a sensor data point. A multiplicity of pixels in turn span a pixel space, in the two-dimensional case for example pixels of a visual output unit, for example a screen or display.

In one advantageous embodiment, after outputting the cluster result, at least one of the parameter values is changed and method steps c), d) and e) are carried out again with the at least one changed parameter value.

This has the advantage of being able in the short term to visualize, that is to say pictorially calculate and represent, cluster results with altered parameters. Such a time-optimized calculation and representation of cluster results with different parameters allows simple recognition of effects of the parameter change on the resulting cluster results. A user thus learns to understand the clustering algorithm, without needing to have a deeper understanding of the technical implementation. A parameter setting of the actual density-based cluster method in a manner adapted to the technical conditions and domain knowledge of an expert is thus possible.

In one advantageous embodiment, the pixel space is spanned by a two-dimensional coordinate system, wherein a different variable of the sensor data points is assigned to each coordinate.

In a two-dimensional pixel space, variables which have a dependence on one another can preferably be compared to one another. Examples of variables assigned to the two coordinates are for example power and speed, intensity and wear, turnover and profit, number and duration. Preference is also given to measurement variables which, multiplied together, physically yield a power, such as, for example, voltage and current, rotational speed and torque, or else flow rate and pressure, in order to determine regions of identical power, for example. Preference is also given to variables such as tool number or maximum current, or pressure, which depend on a further common characteristic variable, thus resulting in clear groups.

The designations cluster and group are used as synonyms in this document and denote a similarity structure of similar objects.

In one advantageous embodiment, the ratio of the extent of the two coordinates to one another corresponds in each case to the ratio of the value ranges of the assigned variable of the sensor data points to one another, wherein in particular at least one value range comprises normalized sensor data values or at least one value range comprises sensor data values according to a distribution function.

This allows an intuitive representation. Normalization of the sensor data values and subsequent assignment to a coordinate reduce an error during subsequent cluster formation. In the case of a nonuniform distribution of the data points, one uniform distribution of the data points among the pixels can be achieved by means of the arrangement of the data points in accordance with a distribution function.

In one advantageous embodiment, the cluster method is a density-based spatial cluster analysis method with noise, which is also referred to by the abbreviation DBSCAN.

This has the advantage that a very frequently used cluster analysis method is approximated in a time-optimized manner.

In one advantageous embodiment, a distance value is a first parameter of the cluster method and the minimum number of sensor data points for forming a cluster is a second parameter of the cluster method.

This makes it possible to apply the main parameters of density-based cluster analysis methods in a time-optimized manner, by way of the visual method, to display and to be able to analyze a cluster result resulting therefrom.

In one advantageous embodiment, determining core points from the multiplicity of sensor data points is a first operation of the density-based cluster method in the data space and this first operation is mapped onto a first pixel operation in the pixel space, wherein the first pixel operation checks, for each sensor data point to which a pixel data point under consideration is assigned, whether the number of pixel data points which are arranged around the pixel data point under consideration within a distance value according to the first received parameter value is equal to the second received parameter value or greater than the second received parameter value.

By replacing the first operation of the density-based cluster method by a first pixel operation in the pixel space, it is possible to use graphical methods for calculating and representing the cluster result. These require a smaller number of computation steps, scale only linearly instead of quadratically, for example, and thus enable an implementation in real time.

In one advantageous embodiment, the number of pixel data points around the pixel data point under consideration within a distance value according to the first received parameter is determined by determining all pixel data points which are arranged within a structure element, wherein the structure element is arranged in a centered manner around the pixel data point under consideration, and the spatial extent of the structure element is dependent on the first received parameter value.

By using a structure element, it is possible to carry out the pixel data operation for determining a core point very efficiently by using operations from image processing.

In one advantageous embodiment, a shape of the structure element is dependent on a distance measure applied in the cluster method, in particular the structure element being round for a Euclidean distance measure, the structure element being rhomboidal for a Manhattan distance measure, and the structure element being square for a Chebyshev distance measure.

This has the advantage that the determination of core points and thus of clusters in the pixel space can be flexibly adapted to a distance measure used in the density-based cluster method. The different distance measures are approximated by the different shape of the structure element.

In one advantageous embodiment, each pixel data point in the pixel space is represented in a color depending on a minimum distance between the pixel data point and a nearest core point.

This has the advantage that not just the association with a cluster but the spatial proximity or the distance between a pixel data point and a core point is represented. As a result, it is possible even more clearly to visualize the density distribution of the sensor data points and to correspondingly adapt at least one of the parameters in an analysis of the visually represented cluster result.

In one advantageous embodiment, a contour of a cluster is displayed by representing in a colored manner the pixel data points which are at a distance of half the first parameter value, preferably additionally the pixel data points which are at a distance of a whole first parameter value, from a nearest core point.

Determined groups or clusters are delimited from one another in a clearly recognizable and selective manner by such a contour. Such a contour thus indicates data points at the same distance from "outer" core points of the cluster determined and is also referred to as an isocontour. A further isocontour having the distance value of half a parameter value specifies a possible further separating line between cluster points and pixel data points regarded as noise or abnormal, for example. A representation of the contour lines enables, in particular clearly, an influence of changed parameter values on the clusters determined to be visualized and thus made evaluatable for a user. All pixel data points outside these two contours which correspond to a sensor data point are regarded as noise or abnormal and represented separately in a color that is distinguishable from the surrounding pixels to which no sensor data point is assigned.

In one advantageous embodiment, the pixels are represented according to a shading depending on a spatial distribution of the core points in the pixel space. The shading is effected on the basis of illumination by an imaginary light source.

This has the advantage of being able to better assess the positioning of individual pixel data points in proximity to cluster boundaries. In particular, a user himself/herself can set the degree of the 3D effect or cause it to be set automatically on the basis of the relative number of data points in proximity to the contour or further characteristic values.

In one advantageous embodiment, for more than two-dimensional sensor data points a two-dimensional method is carried out with two predefinable variables with respect to a selected data value of a third variable of the sensor data points and a change in the cluster result of the two-dimensional method is represented by way of a change in the selected data value of the third variable.

This allows a third variable to be included in the graphical calculation and visual representation of the cluster result. By means of a for example continuous, step-by-step change in the third variable and corresponding continuous representation of the corresponding cluster results, the variation of the clusters depending on said third variable can become visible and thus be analyzed by a user or expert and at least one parameter value of the first and second parameters input can be adapted. The third variable, which corresponds to a third data dimension, can thus be represented by an animation of the two-dimensional sensor data on the basis of a third dimension. For good interpretability by an expert, time steps or operating states are recommended as third dimension.

A second aspect of the present invention relates to an assistance apparatus which carries out a parameterization of an anomaly detection method, in particular implemented in an anomaly detection apparatus (90), on the basis of a multiplicity of sensor data points by means of a density-based cluster method, comprising
  a) a mapping unit configured in such a way as to transfer each sensor data point into a pixel data point in a pixel space,
  b) a simulating unit configured in such a way as to simulate at least one operation of the density-based cluster method in the data space by means of at least one pixel operation in the pixel space,
  c) an input unit configured in such a way as to receive at least one parameter value for each parameter of the density-based cluster method,
  d) an operation unit configured in such a way as to apply at least one pixel operation to the pixel data points according to the parameter values,
  e) an output unit configured in such a way as to represent cluster results in the pixel space in visual form, and
  f) a providing unit configured in such a way as to provide the received parameter values as input parameters for the anomaly detection method.

Such an assistance apparatus, comprising at least one processor, makes it possible to calculate the cluster result no longer in the original data space, but rather in a pixel space. The run time for calculating the cluster result is therefore no longer dependent on the number of data points, but rather the number of pixels, that is to say the resolution of the visualization, and the parameter values chosen. The choice of the number of pixels can be used in weighing between resolution and computation time. This can accelerate the approach enormously, especially for large data sets. It is thus possible to calculate cluster results in real time.

In one advantageous embodiment, the pixel space is configured by a multiplicity of pixels of at least one partial region of the output unit, in particular of a screen.

A pixel denotes an image point of a visual output unit. However, a pixel can also be a group of physical image points if the resolution of the input unit is greater than the resolution of the pixel data points in the pixel space.

In one advantageous embodiment, the input unit and the output unit are configured as a graphical user interface configured in such a way as to represent a graphical input element for at least one parameter and by way of that to select and to receive the corresponding parameter value.

This enables a simple and intuitive possibility for change or input of the parameters which makes a relationship between the received parameters and the cluster result recognizable particularly when the cluster result is represented simultaneously.

In a third aspect, the present invention relates to a computer program product (non-transitory computer-readable storage medium having instructions, which when executed by a processor, perform actions).

Unless indicated otherwise in the following description, the terms "map", "simulate", "receive", "apply", "output", "provide" and the like preferably refer to actions and/or processes and/or processing steps which alter and/or generate data and/or convert the data into other data, wherein the data can be represented or be present as physical variables, in particular.

In connection with the present invention, a processor can be understood to mean for example a computer, a machine or an electronic circuit. Moreover, a processor can be a virtualized processor embodied for example in a server shared by many users, also referred to as cloud. A respective "unit", for example the mapping unit or simulating unit, can be implemented in terms of hardware and/or else in terms of software. In the case of an implementation in terms of hardware, the respective unit can be embodied as an apparatus or as part of an apparatus, for example as a computer, as part of a computer such as, for example, a graphics card or as a microprocessor. In the case of an implementation in terms of software, the respective unit can be embodied as a computer program product, as a function, as a routine, as part of a program code or as an executable object.

A computer program product can be provided or supplied for example as a storage medium such as, for example, a memory card, USB stick, CD-ROM, DVD or else in the form of a downloadable file from a server in a network.

BRIEF DESCRIPTION

Some of the embodiments will be described in detail, with reference to the following figures, wherein like designations denote like members, wherein.

Mutually corresponding parts are provided with the same reference signs in all of the figures.

DETAILED DESCRIPTION

In order to carry out a data-based anomaly detection, for example for an industrial installation or a technical device, this requires a selection of input parameters that characterize a cluster into a cluster method. The parameters can be input into an anomaly detection apparatus, for example, and the sensor data to be examined can be determined according to the input parameters of clusters of sensor data points and the result of the cluster method can be output. It is only on the basis of the cluster result that it is possible to estimate whether the input parameters lead to a cluster result that is expedient for the area of application. Carrying out the cluster analysis again with changed parameters is thus necessary a number of times. Since the time for determining a cluster result is time-consuming particularly in the case of a large amount of data, the parameters for the cluster method can be determined in a time-optimized manner and already with the inclusion of expert knowledge by means of the method below.

In this case, the functioning of a density-based cluster method is appreciated by way of an interactive visualization. This is done approximately in real time. Therefore, a user no longer interacts with the slow density-based cluster method that carries out a calculation of clusters on the basis of sensor data points in a data space, but rather directly with an interactive, visually represented method which is carried out using data processing methods from the image processing field and which approximates an effect of parameter changing in a density-based cluster method directly and in real time.

Figure 1:
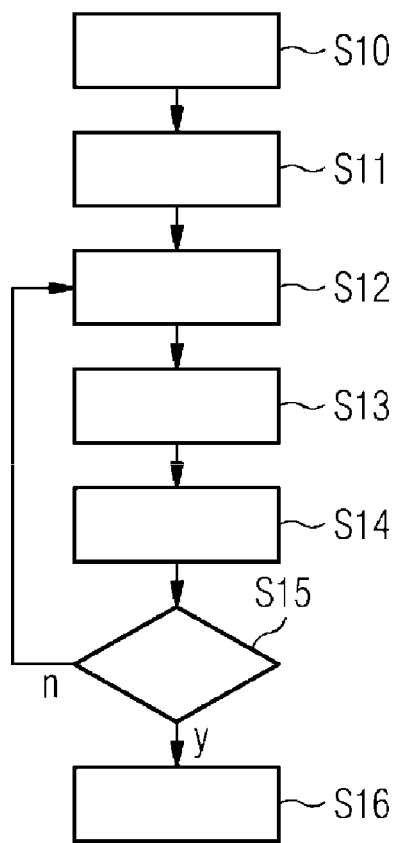
FIG. 1 depicts an exemplary embodiment of the method as a flow diagram.

The cluster method is provided with an, in particular large, number of data points, in particular sensor data points, for which a relationship in the form of a density distribution of data points in groups, so-called clusters, is intended to be determined. FIG. 1 shows the method as a flow diagram. In a first method step S10, each sensor data point in a data space is mapped into a pixel data point in a pixel space.

Figure 3:
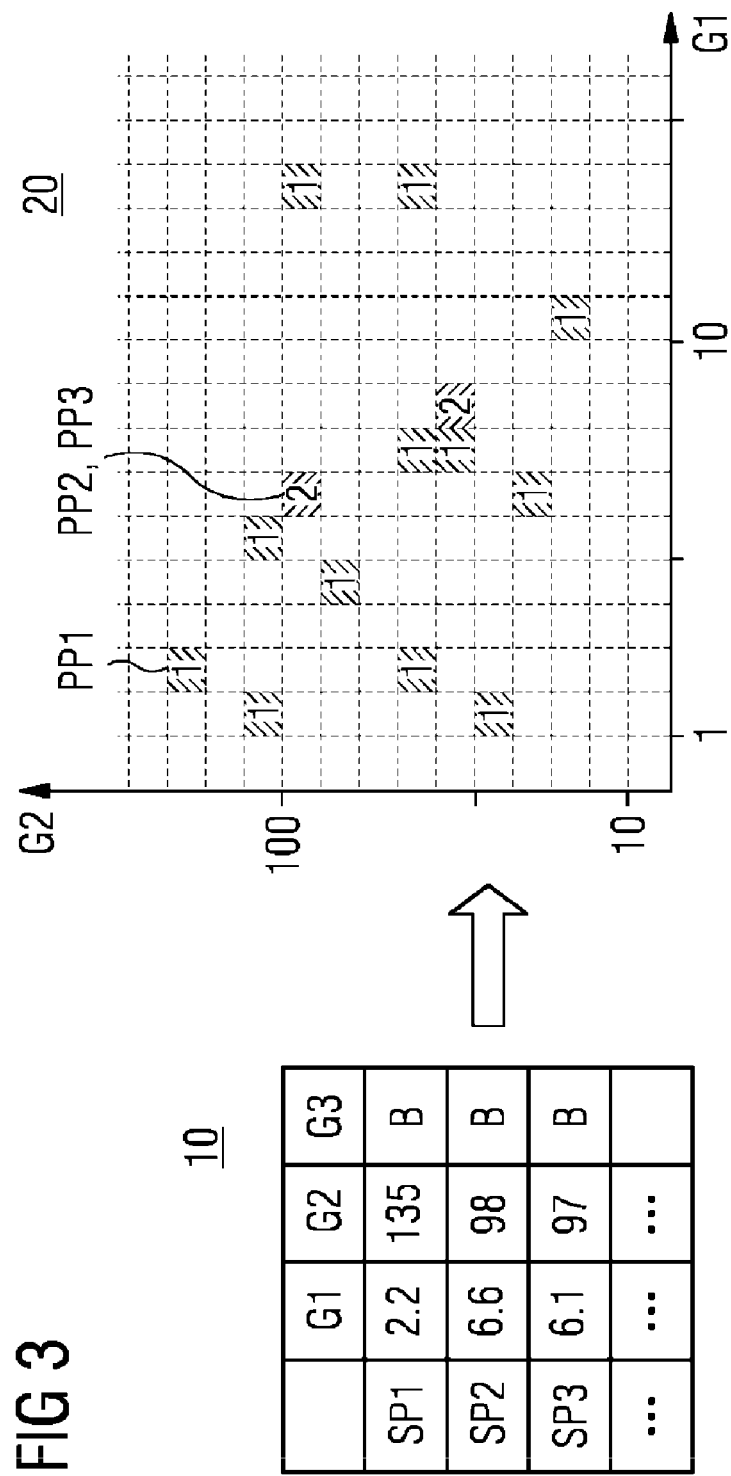
FIG. 3 depicts a schematic illustration of the mapping of sensor data points in a three-dimensional data space into pixel data points of a two-dimensional pixel space.

FIG. 3 shows for a three-dimensional data space 10 by way of example sensor data points SP1, SP2, SP3, each having a value for a respectively different variable G1, G2, G3. The variable G1 could indicate the power, for example, and the variable G2 the speed, for example. G3 could be a predetermined time or an operating mode. The sensor data points here are mapped into a two-dimensional coordinate system with the extents of a pixel space 20, for example of image points of a visual output unit, such as a screen, for example. The mapping is symbolized by the arrow. For this purpose, all data points of the variables G1, G2 given a fixed value of the variable G3, for example the value B, are taken into account for the cluster analysis. In this regard, for example, the sensor data point SP1 in the data space 10 is mapped onto a pixel data point PP1 in the pixel space 20. The sensor data point SP2 is correspondingly mapped onto the pixel data point PP2. The sensor data point SP3 is mapped onto the pixel data point PP3, which coincides with the pixel data point PP2 since the resolution of the pixel data space 20 does not provide a separate pixel for this value.

In the example shown, the ratio of the extent of the pixel space 20, that is to say the ratio of the coordinates for the variables G1 and G2, is equal to the ratio of the value ranges of the input data. The scaling of the two coordinates is identical in the ideal case. The greater the deviation of the scaling, the greater the error when the clusters are subsequently determined. Therefore, in the case of large differences in the value ranges, a normalization of the sensor data points is to be performed beforehand. The determination of the clusters should then also be carried out on the normalized data points. For each pixel in the pixel space 20, the number of sensor data points which are mapped onto these pixel positions is calculated. For the pixel positions of the pixel data point PP2, the number of sensor data points projected thereon, i.e. here the value 2, is therefore recorded.

Figure 4:
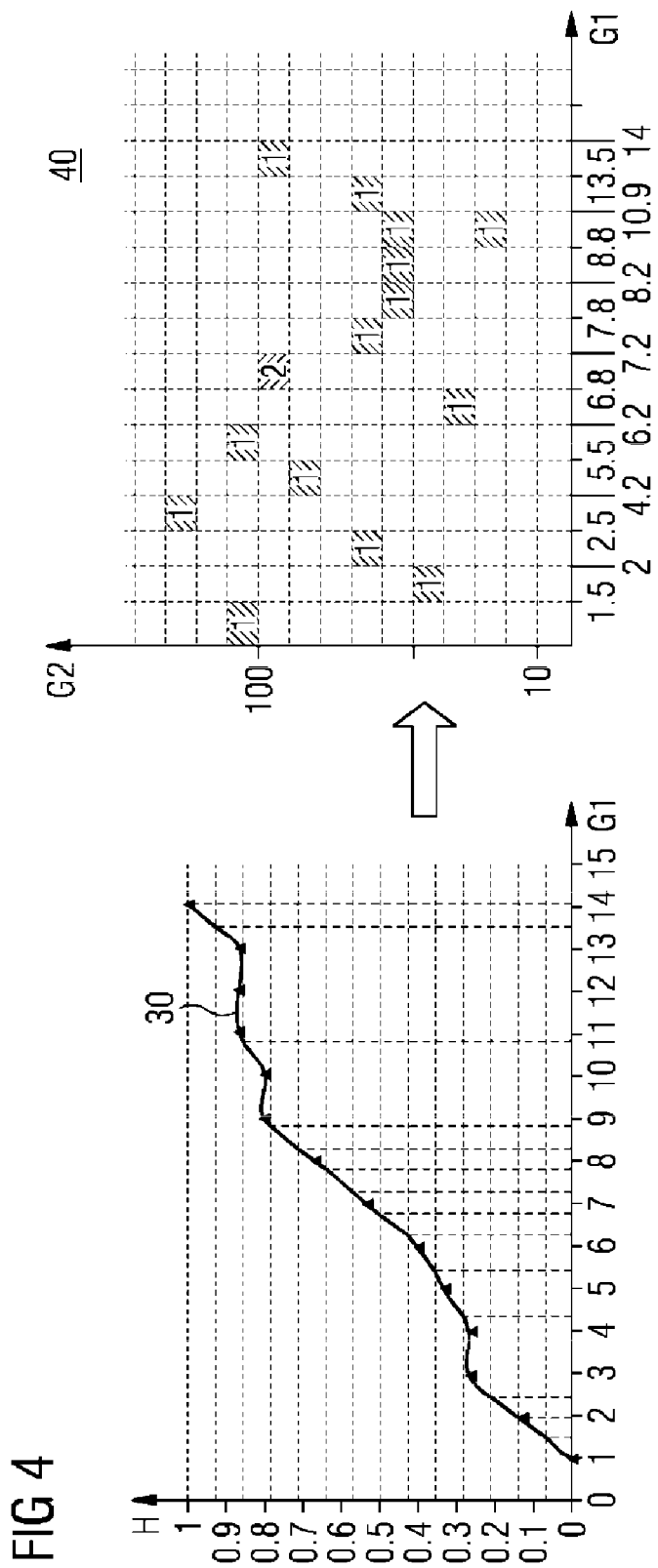
FIG. 4 depicts a schematic illustration concerning the extent and classification of a coordinate according to a distribution function of the sensor data values.

In order to achieve a particularly good resolution of the pixel data points in the case of a greatly varying density distribution of the sensor data points, a value range of sensor data values can be classified according to a distribution function 30. FIG. 4 shows such a distribution function 30 on the left-hand side, in which function the frequency H with which a value of the variable G1 is present is plotted against the value range of the variable G1. On the right-hand side of FIG. 4, the coordinate of the variable G1 of the pixel space 40 is scaled according to the distribution function 30. In this case, the distances between respectively two values of G1 marked in blue are converted to identical distances of the coordinate G1 in the pixel space 40. This has the disadvantage, however, that a cluster determination based thereon deviates from the usual distribution of the data points and thus from the usual known representation for the domain expert. An interpretation of the cluster result is thus possibly made more difficult.

In the next method step S11, see FIG. 1, at least one operation of the density-based cluster method in the data space is then simulated by at least one pixel operation in the pixel space. One very frequently used density-based cluster method is a so-called density-based spatial cluster analysis method with noise, also referred to as DBSCAN for short. This cluster method is controlled by way of two parameters, a distance value c and a threshold value for the minimum number of data points (minPts) which represent a group or a cluster.

Figure 2:
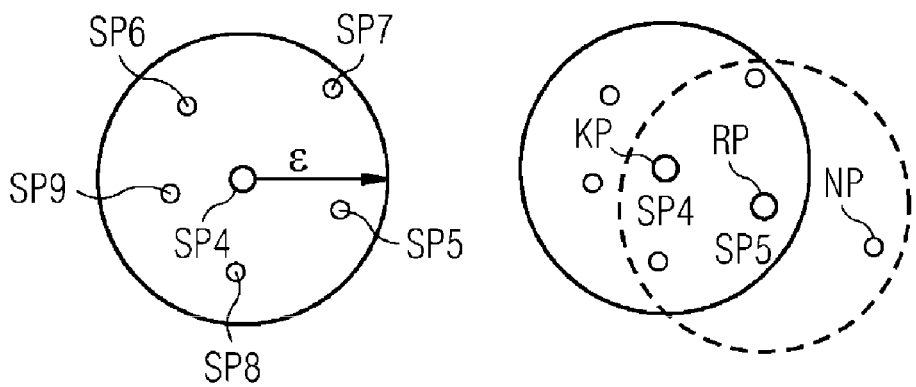
FIG. 2 depicts a schematic illustration of parameters of a density-based cluster method.

FIG. 2 schematically illustrates these parameters and further characteristic variables for cluster determination in the DBSCAN cluster method. In order to find a dense region in the data space, that is to say a cluster, for each sensor data point SP4 a check is made to ascertain how many other sensor data points are present at a distance less than the predefined distance value E. In the left-hand region of FIG. 2, a plurality of sensor data points SP4-SP9 are represented by points, and the sensor data point SP4 under consideration is marked with a thicker contour. The arrow shows a distance c corresponding to the predefined first parameter and specifying a distance. If the number of sensor data points in the vicinity of the sensor point SP4 under consideration is greater than or equal to the predefined second parameter minPts, which specifies a threshold value for the number of neighboring data points, then the sensor data point SP4 under consideration is a core point of a cluster. If the threshold value is fixed at the number of five data points, for example, then the sensor data point SP4 is a core point KP. All sensor data points which themselves are not core points but lie within the distance c with respect to an existing core point are referred to as marginal points. The sensor data point SP5 on the right-hand side of FIG. 2 is a marginal point, for example, since it is at a distance less than the predefined distance c from the core point SP4, but is not a core point itself since only four data points are at a distance E. A point NP is referred to as a noise point if it is at a distance greater than the predefined first parameter c with respect to the nearest core point.

Figure 5:
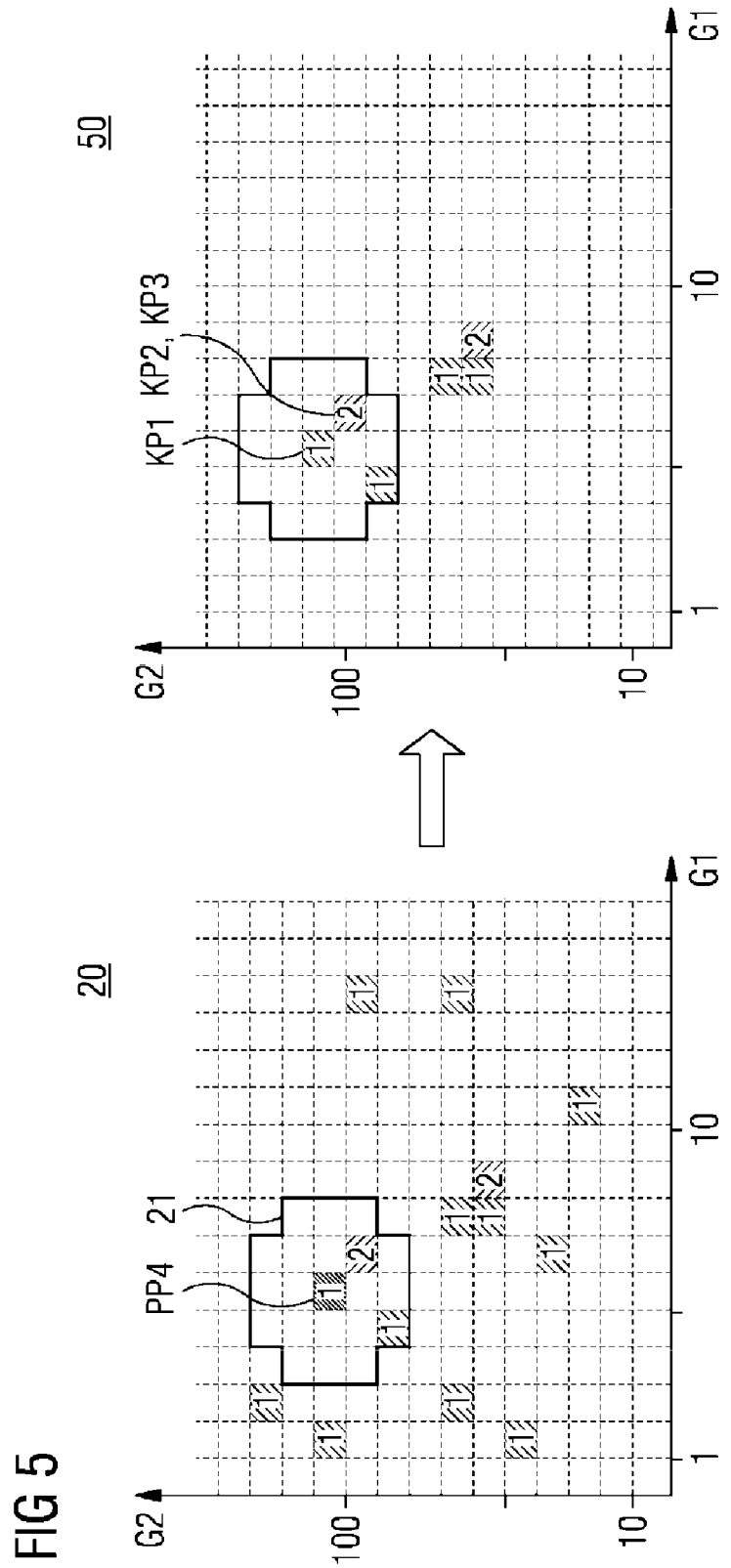
FIG. 5 depicts a schematic illustration of the first pixel operation.

The process of determining core points and clusters is then simulated by a pixel operation in the pixel space. FIG. 5 shows, on the left-hand side, the representation of the sensor data values in a pixel space 20 as known from FIG. 3. The representation corresponds to a two-dimensional histogram comprising, in addition to each pixel, the number of sensor data points that are represented by the same pixel. The above-described first operation of the density-based cluster method in the data space is then mapped onto a first pixel operation in the pixel space. The first pixel operation checks, for each sensor data point to which a pixel data point PP4 under consideration is assigned, whether the number of pixel data points which are arranged around the pixel data point PP4 under consideration within a distance value c according to a first parameter value is greater than the second parameter value, namely the minimum number of data points minPts in a cluster.

In an implementation of this operation, for example, for each entry in the 2D histogram, see pixel space 20, which has a value not equal to zero, a check is made to ascertain whether the number of pixel data points within the distance c is greater than the threshold value of the number of points minPts. For this purpose, for example, the pixel data point PP4 is examined as pixel data point under consideration by using a structure element 21 of the extent according to the first parameter E. If this is satisfied, the point PP4 is stored as core point KP in a separate result matrix 50, see the right-hand side of FIG. 5. It is possible to check whether a pixel data point falls within a structure element 21 in a time-optimized manner by means of expedient implementation. In particular, an implementation by counting the number of data points in the neighborhood with respect to a pixel data point PP4 under consideration from the 2D histogram 20 enables a fast implementation execution.

The next method step S12 of the method according to the present invention, see FIG. 1, then involves receiving at least one parameter value for each parameter of the density-based cluster method. Consequently, the size of the structure element c and the threshold value for the number of pixel data points minPts that form a cluster are then defined for the procedure already described. A distance measure that is intended to be applied in the cluster method can be defined as a further parameter. According to such a distance measure, a different structure element 21 is used in the pixel operation. A round structure element 21 is used for a Euclidean distance measure. A rhomboidal structure element is used for a Manhattan distance measure, and a square distance measure is used for a Chebyshev distance measure. The pixel operation described is then applied to the pixel data according to the received parameter values in method step S13, see FIG. 1, and the cluster result is output in visual form in the pixel space in step S14.

For outputting (S14) the cluster results, after determining the core points KP1, KP2, KP3 of the clusters for each pixel in the pixel space 20 the minimum distance with respect to the nearest core point KB is calculated from the result matrix 50. A resulting distance field can be calculated very efficiently for example using an algorithm from Meijster et al. described in "A General Algorithm for Computing Distance Transforms in Linear Time," in Mathematical Morphology and its Applications to Image and Signal Processing, pages 331-340, Springer 2000. For a visual representation, the calculated minimum distance with respect to the core points from the distance field is mapped in color. Consequently, each pixel data point in the pixel space is represented in a different color depending on a minimum distance with respect to a nearest core point. Preferably, a diverging color palette is used and, depending on the distance between a pixel and the nearest core point, the pixel color is chosen differently according to a color gradient. The core points themselves are no longer represented separately in the result and are recognizable by way of the color palette. The color palette is preferably defined uniformly for the entire result image.

In order to be able to clearly recognize the edge or the boundaries of a cluster, a delimitation is calculated and depicted. This is done by calculating isocontours on the distance field for a distance of a whole first parameter value ε and preferably a further isocontour with the distance of half the first parameter value ε/2. A user can thus distinguish between core points lying within the isocontour with a distance of half the first parameter value ε/2 and marginal points of the cluster. All points thus defined by a mapping of a sensor data point which lie outside these two contours are regarded as noise or abnormal and are represented separately preferably in a different color than the rest of the pixels.

Figure 6:
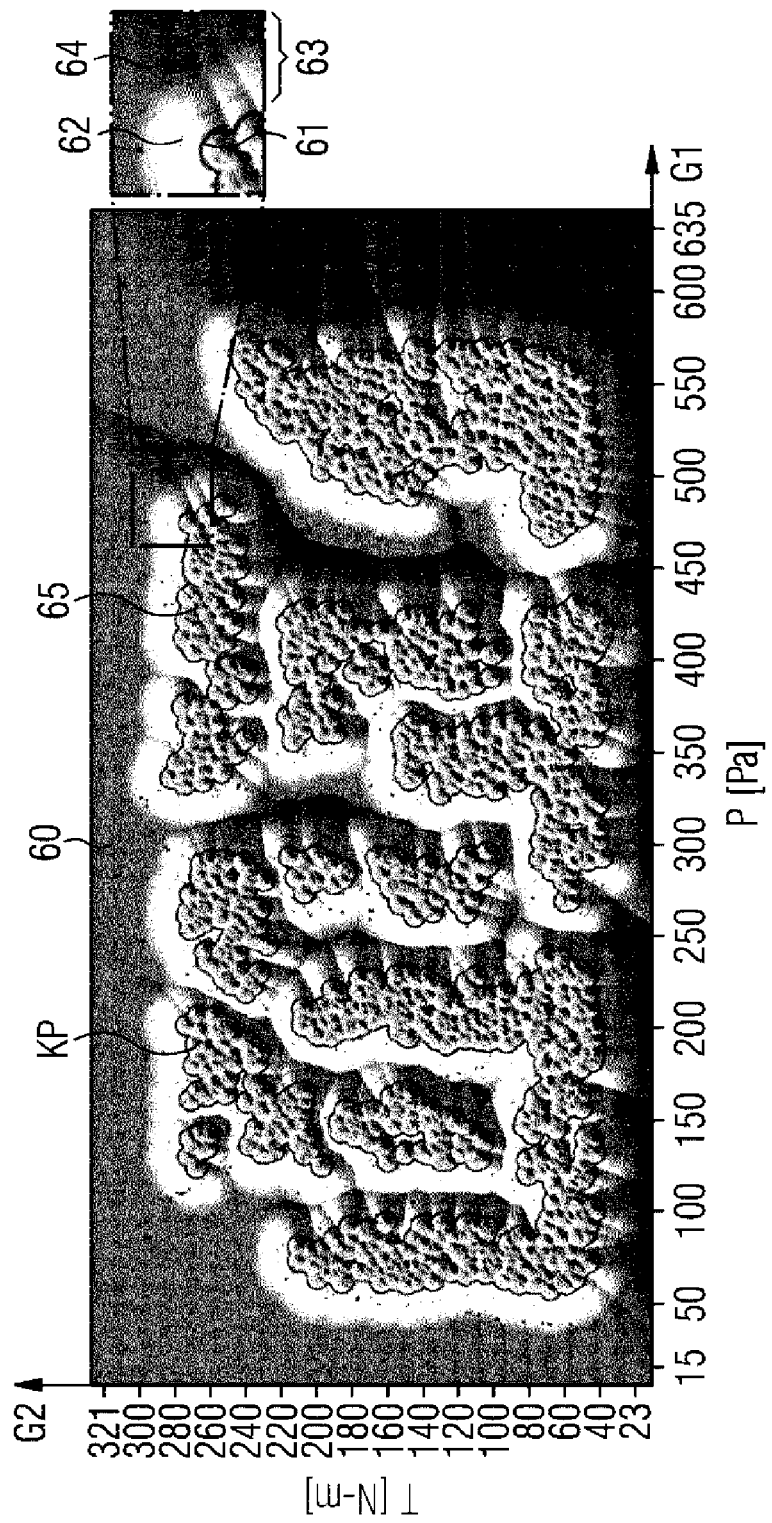
FIG. 6 depicts an exemplary embodiment of a cluster result output by the method in visual form in the pixel space.

A visual representation 60 of the cluster result is illustrated in FIG. 6. In a colored representation, for example, a core point KP is represented in a green color, and the pixels according to their distance from the nearest core point are represented for example in a progressive color scale from green to white.

The excerpt illustrated on the right next to the visual representation of the cluster result 60 illustrates a region of a cluster 65 in an enlarged view. The colored profile outside the cluster 65, see region 63, exhibits a shading that is represented depending on a spatial distribution of the core points in the pixel space. The contour 61 with a distance of half a received parameter value ε/2 is more clearly visible here than the isocontour 62 indicating a distance of a whole first parameter value ε. Noise points 64 are in turn represented with contrasting coloration.

If there is a similar number of pixel data points on both sides near the contour 61, a particularly pronounced level effect produced by the shading is desirable. The reliability of the boundary is made clear as a result. If there is a great difference in the number of pixel data points on both sides of the contour, the uncertainty of the contour at this location can be made clear by a weaker level effect. An accuracy value for the reliability is likewise indicated.

After the cluster result has been output, at least one of the parameter values can be changed, preferably via a graphical user interface, see method step S15 in FIG. 1. If this is the case, the changed parameter value is received in method step S12 in the method and the method steps of applying S13 the pixel operation are carried out again and a cluster result based on the changed parameter values is output, see method step S15. This repeated application of the pixel operations is symbolized by the arrow n. If no further parameter changes are desired, see arrow y, the last received parameter values ε and minPts are provided to the anomaly detection method in method step S16, said method implementing the density-based cluster method with the sensor data points in the data space in an anomaly detection apparatus, for example.

Figure 7:
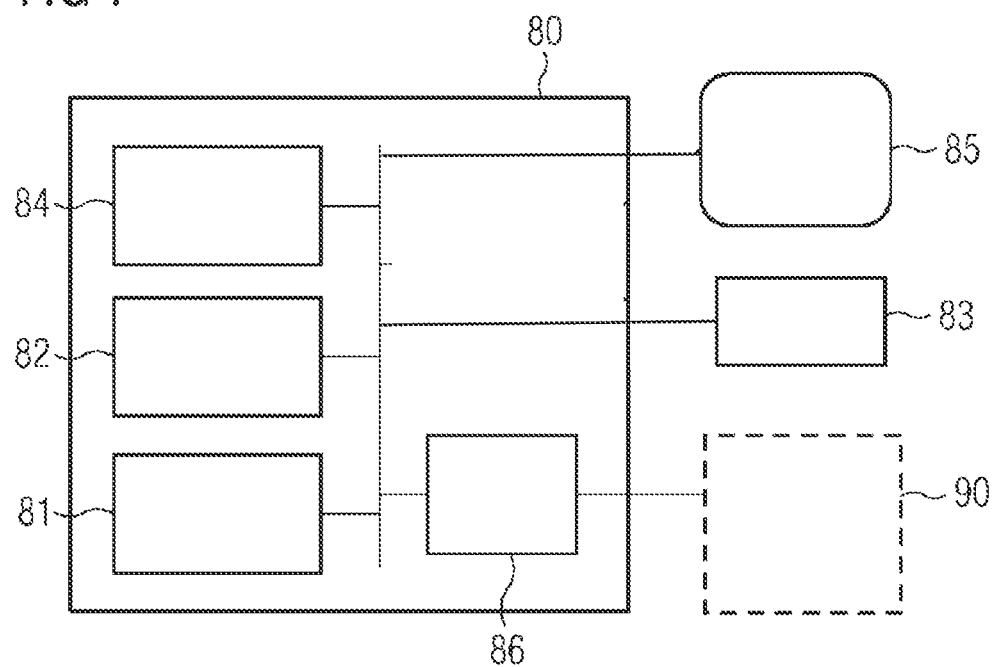
FIG. 7 depicts an exemplary embodiment of an assistance apparatus in a block illustration.

FIG. 7 shows an assistance apparatus 80, which implements the method described. The assistance apparatus 80 comprises a mapping device 81 configured in such a way as to transfer each sensor data point into a pixel data point in a pixel space, a simulating unit 82 configured in such a way as to simulate at least one operation of the density-based cluster method in the data space by means of at least one pixel operation in the pixel space, and also an operation unit 84 configured in such a way as to apply at least one pixel operation to the pixel data points according to the received parameter values. The assistance apparatus 80 furthermore comprises a providing unit 86, which provides the received parameter values to an anomaly detection apparatus 90 as input parameters for an anomaly detection method in the data space. By way of said providing unit 86, the entire quantity of sensor data to be considered can likewise be loaded into the assistance system or be received and stored there. The assistance system 80 furthermore comprises an input unit 83 and a visual output unit 85, which are preferably configured as a graphical user interface.

Figure 8:
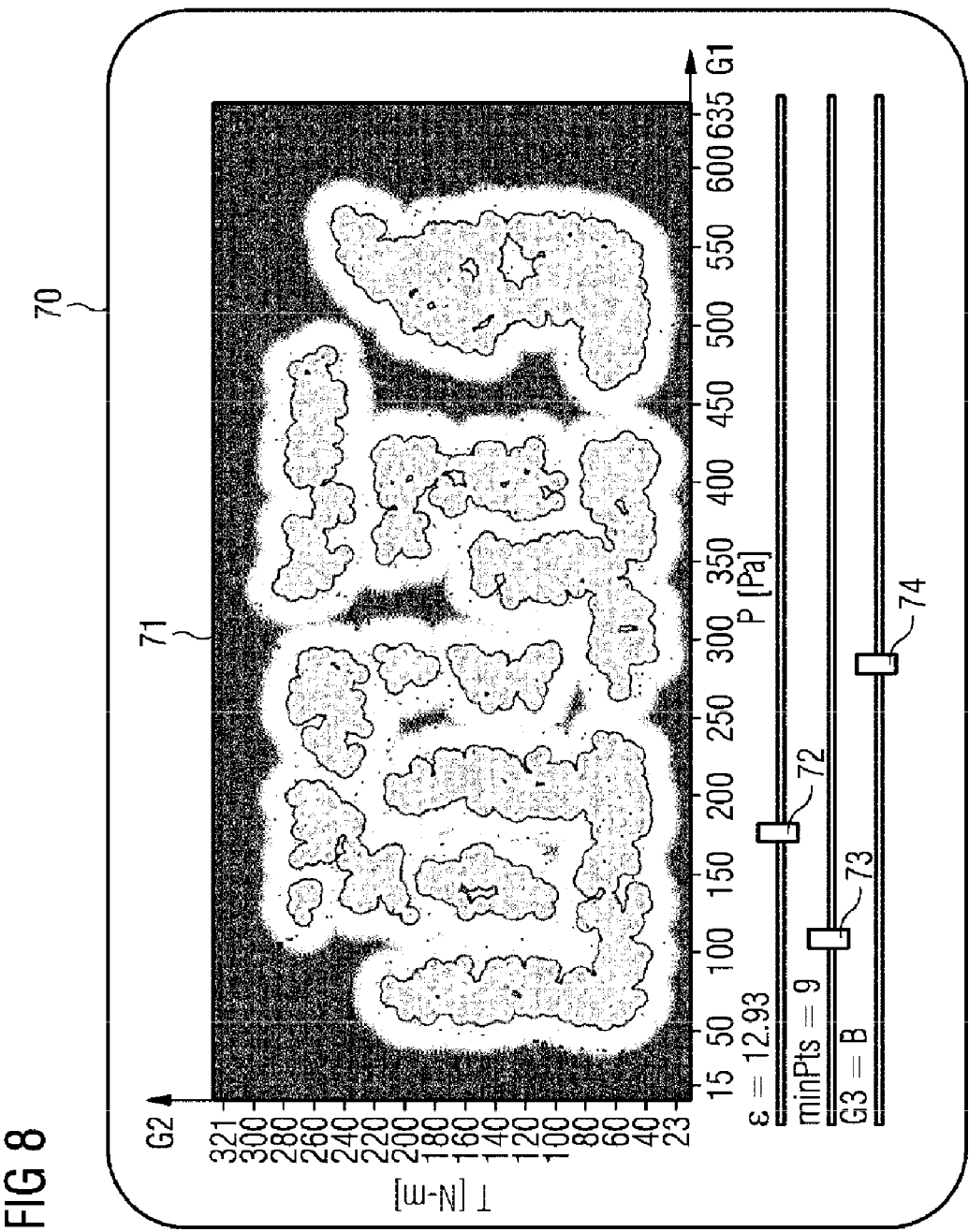
FIG. 8 depicts an exemplary embodiment of an output unit with graphical parameter input elements in a schematic illustration.

FIG. 8 shows an output unit or the graphical user interface 70 represented thereon. In this case, a cluster result is represented in region 71. Respective graphical input element 72, 73 for the first and second parameters ε, minPts are displayed underneath. The graphical input element 72, 73 can be represented in each case as a sliding controller, for example, via which the first and/or the second parameter ε, minPts are/is changed and provided to the operation unit 84 as input for the pixel operation. The clusters are recalculated automatically after a parameter change.

In order to extend the cluster analysis to more than two-dimensional sensor data, aggregation methods, for example, can be applied to two dimensions like self-organizing maps, for example. According to the present invention, a third or further data dimension or a corresponding variable G3 is represented by an animation of the two-dimensional cluster analysis on the basis of a respectively different sensor data value B of the third variable G3. In this case, a suitable choice of the third dimension G3 can possibly be taken into account by a preceding aggregation of a plurality of data dimensions.

A data value of the third variable G3 can be input by means of a further graphical input element, for example a further sliding controller 74. By way of example, the cluster method can be carried out for progressively changed values of the third variable and the visual representation of the resulting cluster results can be represented as animation. In particular, varying operating conditions such as, for example, stoppage, ramp-up, partial load operation, full load operation, shutdown can be chosen for the third data dimension, such that comparisons of the learned "good and bad areas", which are identified by points within the clusters and outside the clusters, respectively, between different operating conditions are possible. Consequently, the known, wanted operating condition changes are precisely not identified as an anomaly. Variations of pixel data points for different operating conditions, that is to say a different third dimension of variables, can be represented on the basis of trajectories for example of core points or selected points of the contour lines 61, 62.

The method described and the apparatus described make it possible to determine suitable parameter values for a first analysis in the data space by means of the graphical approximated implementation of the cluster method in a pixel space in a time-optimized manner and to subject said parameter values to preliminary checking by way of expert knowledge. By means of the implementation of the cluster method in real time and a simple change of the parameters, the influence of the parameters on the cluster result can be clearly represented and the behavior of the cluster method depending on the input parameters can be demonstrated even to a non-expert. Consequently, the time-consuming data-based cluster method in the data space can be carried out only for previously examined parameter values deemed to be expedient and can thus contribute to a time-optimized anomaly detection process. By way of a suitable mapping of the variables onto the pixel space, computation time can be weighed against resolution, such that an operator of an installation rapidly acquires a rough overview, for example, which, in the event of anomalies occurring, can then be examined in detail by maintenance staff with an analysis of longer duration.

All features described and/or depicted can advantageously be combined with one another within the scope of the present invention. The present invention is not restricted to the exemplary embodiments described.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

What is claimed:

1. A method for parameterizing an anomaly detection method which carries out a density-based cluster method on a basis of a multiplicity of sensor data points, the method comprising:
    a) mapping, by at least one processor, each sensor data point in a data space into a pixel data point in a pixel space spanned by a multiplicity of pixel data points;
    b) simulating, by the at least one processor, at least one operation of the density-based cluster method in the data space by means of at least one pixel operation in the pixel space;
    c) receiving, by the at least one processor, at least one parameter value for each parameter of the density-based cluster method;
    d) applying, by the at least one processor, the at least one pixel operation to the pixel data points according to the received parameter values;
    e) outputting, by the at least one processor, a cluster result in visual form in the pixel space; and
    f) providing, by the at least one processor, the received parameter values for the anomaly detection method.

2. The method as claimed in claim 1, wherein after outputting the cluster result, at least one of the parameter values is changed and method steps c), d) and e) are carried out again with the at least one changed parameter value.

3. The method as claimed in claim 1, wherein the pixel space is spanned by a two-dimensional coordinate system, wherein a different variable of the sensor data points is assigned to each coordinate.

4. The method as claimed in claim 3, wherein a ratio of the extent of the two coordinates to one another corresponds in each case to a ratio of the value ranges of the assigned variable of the sensor data points to one another, or at least one value range comprises normalized sensor data values or at least one value range comprises sensor data values according to a distribution function.

5. The method as claimed in claim 1, wherein the cluster method is a density-based spatial cluster analysis method with noise.

6. The method as claimed in claim 5, wherein a distance value is a first parameter of the cluster method and the minimum number of sensor data points for forming a cluster is a second parameter of the cluster method.

7. The method as claimed in claim 5, wherein determining core points from the multiplicity of sensor data points is a first operation of the density-based cluster method in the data space and this first operation is mapped onto a first pixel operation in the pixel space, further wherein the first pixel operation checks, for each sensor data point to which a pixel data point under consideration is assigned, whether the number of pixel data points which are arranged around the pixel data point under consideration within a distance value according to the first received parameter value is equal to the second received parameter value or greater than the second received parameter value.

8. The method as claimed in claim 7, wherein the number of pixel data points around the pixel data point under consideration within a distance value according to the first received parameter is determined by determining all pixel data points which are arranged within a structure element, wherein the structure element is arranged in a centered manner around the pixel data point under consideration, and the spatial extent of the structure element is dependent on the first received parameter value.

9. The method as claimed in claim 8, wherein a shape of the structure element is dependent on a distance measure applied in the cluster method, in particular the structure element being round for a Euclidean distance measure, the structure element being rhomboidal for a Manhattan distance measure, and the structure element being square for a Chebyshev distance measure.

10. The method as claimed in claim 1, wherein each pixel data point in the pixel space is represented in a color depending on a minimum distance between the pixel data point and a nearest core point.

11. The method as claimed in claim 1, wherein a contour of a cluster is displayed by representing in a colored manner the pixel data points which are at a distance of half the first parameter value, preferably additionally the pixel data points which are at a distance of a whole first parameter value, from a nearest core point.

12. The method as claimed in claim 1, wherein the pixels are represented according to a shading depending on a spatial distribution of the core points in the pixel space.

13. The method as claimed in claim 1, wherein for more than two-dimensional sensor data points a two-dimensional method is carried out with two predefinable variables (dimensions) with respect to a selected data value of a third variable of the sensor data points and a change in the cluster result of the two-dimensional method is represented by way of a change in the selected data value of the third variable.

14. An assistance apparatus for parameterizing an anomaly detection method implemented in an anomaly detection apparatus, carried out on a basis of a multiplicity of sensor data points by means of a density-based cluster method, comprising:
at least one processor configured to:
a) map each sensor data point in a data space into a pixel data point in a pixel space;
b) simulate at least one operation of the density-based cluster method in the data space by means of at least one pixel operation in the pixel space spanned by a multiplicity of pixel data points;
c) receive at least one parameter value for each parameter of the density-based cluster method;
d) apply at least one pixel operation to the pixel data points according to the received parameter values;
e) output cluster results in the pixel space in visual form; and
f) provide the received parameter values as input parameters for the anomaly detection method.

15. The assistance apparatus as claimed in claim 14, wherein the pixel space is configured by a multiplicity of pixels of at least one partial region of a screen coupled to the at least one processor.

16. The assistance apparatus as claimed in claim 14, further comprising a graphical user interface configured in such a way as to represent a graphical input element for at least one parameter and by way of that to select and to receive the corresponding parameter values.

17. A non-transitory computer program product, comprising a non-transitory computer readable hardware storage device having computer readable program code stored therein, said program code executable by a processor of a computer system to implement the method as claimed in claim 14.

* * * * *